(12) United States Patent
Kunimatsu et al.

(10) Patent No.: US 8,228,677 B2
(45) Date of Patent: Jul. 24, 2012

(54) TAPE WIRING SUBSTRATE AND SEMICONDUCTOR CHIP PACKAGE

(75) Inventors: Daisuke Kunimatsu, Tokyo (JP); Takehiro Takayanagi, Ibaraki (JP)

(73) Assignee: Lapis Semiconductor Co., Ltd. (JP)

( * ) Notice: Subject to any disclaimer, the term of this patent is extended or adjusted under 35 U.S.C. 154(b) by 547 days.

(21) Appl. No.: 12/379,354

(22) Filed: Feb. 19, 2009

(65) Prior Publication Data
US 2009/0231823 A1 Sep. 17, 2009

(30) Foreign Application Priority Data
Mar. 14, 2008 (JP) ................. 2008-066040

(51) Int. Cl.
*H05K 1/00* (2006.01)

(52) U.S. Cl. ........ 361/749; 361/751; 174/254; 174/260; 174/261; 257/684; 257/773; 257/778; 257/784; 345/204; 345/206; 349/150

(58) Field of Classification Search .......... 361/749, 361/751; 174/254, 260, 261; 257/684, 773, 257/778, 784; 345/204, 206; 349/105, 150
See application file for complete search history.

(56) References Cited

U.S. PATENT DOCUMENTS

| | | | | |
|---|---|---|---|---|
| 5,670,994 A * | 9/1997 | Kawaguchi et al. | .......... | 345/206 |
| 5,822,191 A * | 10/1998 | Tagusa et al. | ................. | 361/751 |
| 6,617,521 B1 * | 9/2003 | Saito et al. | ..................... | 174/260 |
| 2001/0009299 A1 * | 7/2001 | Saito | .............................. | 257/684 |
| 2001/0040664 A1 * | 11/2001 | Tajima et al. | .................. | 349/150 |
| 2005/0052442 A1 * | 3/2005 | Takenaka et al. | ............. | 345/204 |
| 2005/0121796 A1 * | 6/2005 | Park et al. | ..................... | 257/773 |
| 2006/0267219 A1 * | 11/2006 | Nakamura et al. | ............ | 257/784 |
| 2007/0228582 A1 * | 10/2007 | Kim | ............................... | 257/778 |
| 2008/0055291 A1 * | 3/2008 | Hwang et al. | ................. | 345/204 |

FOREIGN PATENT DOCUMENTS

| JP | 2005-107239 | 4/2005 |
|---|---|---|
| JP | 2005167238 | 6/2005 |
| JP | 2006-332544 A | 12/2006 |

* cited by examiner

*Primary Examiner* — Xiaoliang Chen
(74) *Attorney, Agent, or Firm* — Rabin & Berdo, P.C.

(57) ABSTRACT

A second output wiring and a third output wiring enter into a chip mounting portion while coming across a second side and a third side of the chip mounting portion. The other end portions of the second output wiring and the third output wiring enter into the chip mounting portion are bent toward a fourth side of the chip mounting portion, and are connected to an output pad and an output pad provided along a fourth side of the semiconductor chip. An input wiring extends along the fourth side of the chip mounting portion, is bent from a midstream to enter into the chip mounting portion while coming across the fourth side of the chip mounting portion, and is connected to an input pad provided along the fourth side of the semiconductor chip.

13 Claims, 12 Drawing Sheets

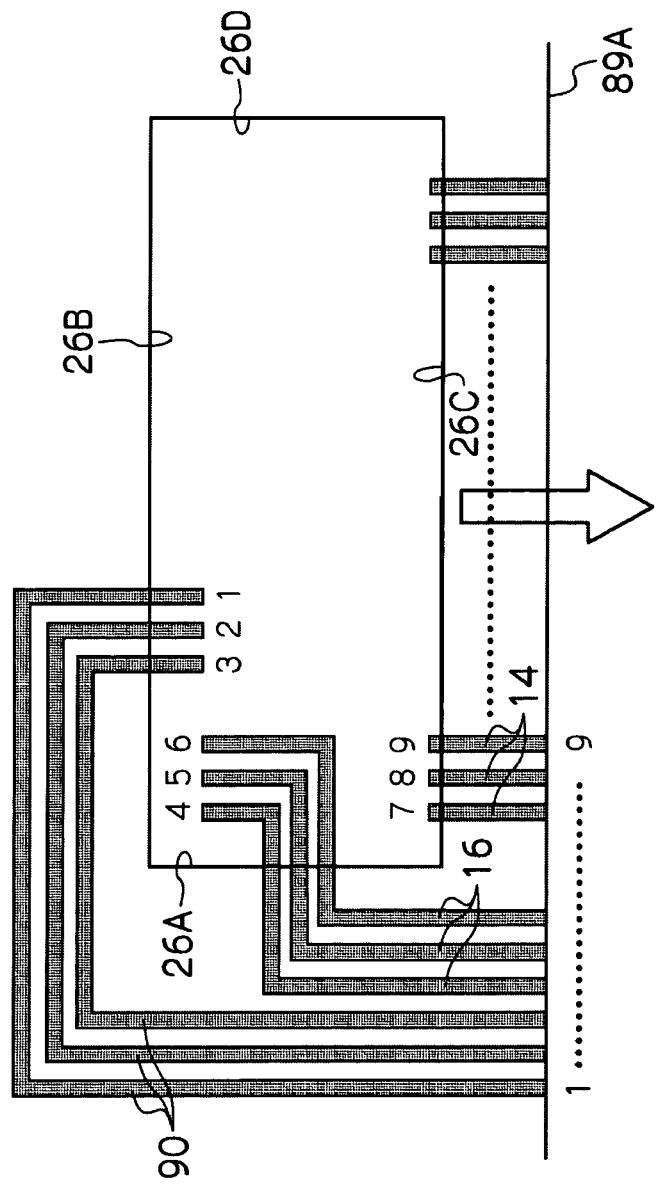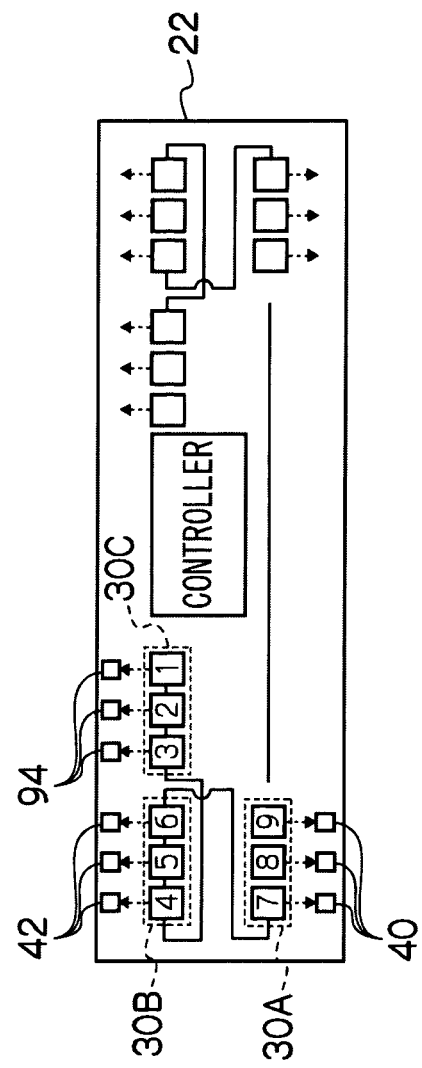
FIG. 8A
FIG. 8B

TAPE WIRING SUBSTRATE AND SEMICONDUCTOR CHIP PACKAGE

CROSS-REFERENCE TO RELATED APPLICATION

This application claims priority under 35 USC 119 from Japanese Patent Application No. 2008-066040, the disclosure of which is incorporated by reference herein.

BACKGROUND OF THE INVENTION

1. Field of the Invention

The present invention relates to a tape wiring substrate and a semiconductor chip package using the same.

2. Description of Related Art

Together with reductions in the sales prices of display devices, a reduction in the cost of the various components thereof has been desired. This situation is also common to a driving IC (a semiconductor chip package) for display devices, and a low cost is desired even when a single tape wiring substrate is used in the driving IC. As an example thereof, a semiconductor chip package fabricated by mounting a rectangular semiconductor chip to a tape wiring substrate, in which a wiring is formed, is described in Japanese Patent Application Laid-Open (JP-A) No. 2005-167238.

The tape wiring substrate is provided with a rectangular chip mounting portion in such a manner as to correspond to the mounted semiconductor chip. Further, the wiring extending to the chip mounting portion is formed in the tape wiring substrate.

On the other hand, the semiconductor chip is provided with electrode pads arranged along one side of the semiconductor chip, and electrode pads arranged along the other side opposing to the one side. The electrode pads arranged along the one side of the semiconductor chip correspond to electrode pads for output signal for driving a display device. Further, the electrode pads arranged along the other side are constituted by electrode pads for input signal actuating the semiconductor chip, and electrode pads for output signal actuating the semiconductor chip mounted to the other driving IC.

In this case, the wiring connected to the electrode pad for the display device arranged in the one side of the semiconductor chip is formed in such a manner as to enter into the chip mounting while coming across a side corresponding to the one side of the semiconductor chip of the chip mounting portion, on the tape wiring board. On the other hand, the wiring connected to the electrode pads arranged in the other side of the semiconductor chip, in other words, the electrode pads for input signal is formed in such a manner as to enter into the chip mounting while coming across a side corresponding to an orthogonal side which is orthogonal to the other side of the semiconductor chip of the chip mounting portion.

In recent years, in order to achieve the low cost of the display device itself, it is desired to reduce the mounting number of the driving IC. In other words, if the number of terminals of the display device itself is constant, it is desired to increase the number of the output terminals per one IC.

However, in the tape wiring board described in JP-A No. 2005-167238, since the electrode pad for the display device is formed only along one side of the semiconductor chip, it is difficult to address problems relating to bonding strength between the semiconductor chip and the tape wiring substrate when the number of electrode pads for the display device rapidly increases.

Particularly, since the wiring on the tape wiring substrate that forms an electrical connection to the electrode pad disposed at the other side of the semiconductor chip is formed so as to enter into the chip mounting and cross a line corresponding to a side orthogonal to the other side of the semiconductor chip of the chip mounting portion, it is difficult to design the tape wiring substrate.

Of the wiring formed in the tape wiring substrate, the wiring connected to the electrode pad disposed at the other side of the semiconductor chip is disposed so as to enter into the chip mounting across a side orthogonal to the other side of the semiconductor chip. If the orthogonal side of the semiconductor chip is short, the amount of wiring that can enter into the chip mounting portion across the orthogonal side is limited (restricted). In other words, if the number of the electrode pads arranged at the other side of the semiconductor chip is large, the tape wiring substrate will be insufficient. Further, since an arrangement of the output terminals of the driving IC for the display device is dependent on the input terminals of the display device side, it is necessary to employ a designated arrangement, and this makes designing the tape wiring substrate difficult.

SUMMARY OF THE INVENTION

The present invention provides a tape wiring substrate and a semiconductor chip package which can be achieved by a small area, even in a semiconductor chip, provided with a lot of electrode pads, while taking the fact mentioned above into consideration.

In accordance with a first aspect of the invention, there is provided a tape wiring substrate including:

a base film in which a wiring is formed;

a chip mounting portion formed on the base film at which a semiconductor chip is mounted;

a first wiring formed on the base film, that enters into the chip mounting portion across a first side of the chip mounting portion;

a second wiring formed on the base film, that enters into the chip mounting portion across a second side that intersects the first side of the chip mounting portion, and that bends at an inner portion of the chip mounting portion so as to extend toward a third side of the chip mounting portion that opposes the first side;

a third wiring formed on the base film, that enters into an inner portion of the chip mounting portion across a fourth side of the chip mounting portion that opposes the second side, and bends at the inner portion of the chip mounting portion so as to extend toward the third side; and a fourth wiring formed on the base film, that extends along the third side, bends, and enters into the inner portion of the mounting portion across the third side.

In accordance with the structure mentioned above, for example, in the case that the semiconductor chip mounted to the tape wiring substrate is provided with the electrode pads arranged along the one side of the semiconductor chip, and the electrode pads arranged along the other side opposing to the one side, the first wiring is connected to the electrode pads arranged along the one side, and the second wiring, the third wiring and the fourth wiring are connected to the electrode pads arranged along the other side.

In other words, it is possible to make smaller the shape of the base film in the direction, which is orthogonal to the third side, in comparison with the case that the wiring connected to the electrode pads arranged along the other side of the semiconductor chip is constituted only by the wiring entering into the chip mounting portion while coming across the third side.

Further, the present invention may be applied even to a semiconductor chip in which a large number of electrode pads are arranged at the other side, compared to when the wiring connected to the electrode pads arranged along the other side of the semiconductor chip is formed only of the wiring entering into the chip mounting portion across the second side and the third side. In other words, the present invention can be applied to a semiconductor chip provided with a lot of electrode pads.

In accordance with a first aspect of the invention, there is provided a semiconductor chip package in which a rectangular semiconductor chip is flip-chip mounted on a tape wiring substrate, wherein the semiconductor chip comprises:
a plurality of first output pads arranged along a first side;
a plurality of second output pads arranged along a fourth side opposite to the first side; and
a plurality of first input/output pads arranged along the fourth side opposite to the first side,
the tape wiring substrate comprises:
a plurality of first output wirings comprising a first end portion arranged at one end of the tape wiring substrate, and a second end portion connected to the first output pad;
a plurality of second output wirings comprising a first end portion arranged at the one end of the tape wiring substrate, and a second end portion connected to the second output pad; and
a plurality of first input/output wirings comprising a first end portion arranged at the one end of the tape wiring substrate, and a second end portion connected to the first input/output pad,
wherein the first end portion of the second output wiring is arranged between the first end portion of the plurality of first output wirings and the first end portion of the plurality of first input/output wirings, and
a line arrangement order of the plurality of first output wirings and the plurality of second output wirings is identical to a line arrangement order of the plurality of first output pads and the plurality of second output pads that correspond to the plurality of first output wirings and the plurality of second output wirings, and a line arrangement order of the plurality of first input/output wirings is identical to a line arrangement order of the plurality of first input/output pads that correspond to the plurality of first input/output wirings.

In accordance with the structure mentioned above, the semiconductor chip is provided with the first output pad along the first side, and the second output pad and the first input/output pad along the fourth side.

In this case, it is possible to parallelize the other end portions of the first output wiring, the second output wiring and the first input/output wiring in which one end portions are arranged in one end of the tape wiring substrate to the respective pads, by inverting the line order of the first input/output pad to the line order of the first output pad and a plurality of second output pads.

As mentioned above, it is possible to provide a semiconductor chip package which can be implemented in a small area even when the semiconductor chip is provided with a lot of electrode pads.

According to the present invention, it is possible to provide a tape wiring substrate and a semiconductor chip package which can be implemented in a small area, even when the semiconductor chip is provided with a lot of electrode pads for output.

BRIEF DESCRIPTION OF THE DRAWINGS

Preferred exemplary embodiments of the present invention will be described in detail based on the following figures, wherein:

FIG. 8A is a plan view showing the tape wiring substrate and a semiconductor chip in accordance with the second exemplary embodiment of the invention;

FIG. 8B is a plan view showing the tape wiring substrate and the semiconductor chip in accordance with the second exemplary embodiment of the invention;

DETAILED DESCRIPTION OF THE INVENTION

A description will be given of a tape wiring substrate in accordance with a first exemplary embodiment of the invention, and a semiconductor chip package employing the tape wiring substrate with reference to FIGS. 1 to 5.

Figure 1:
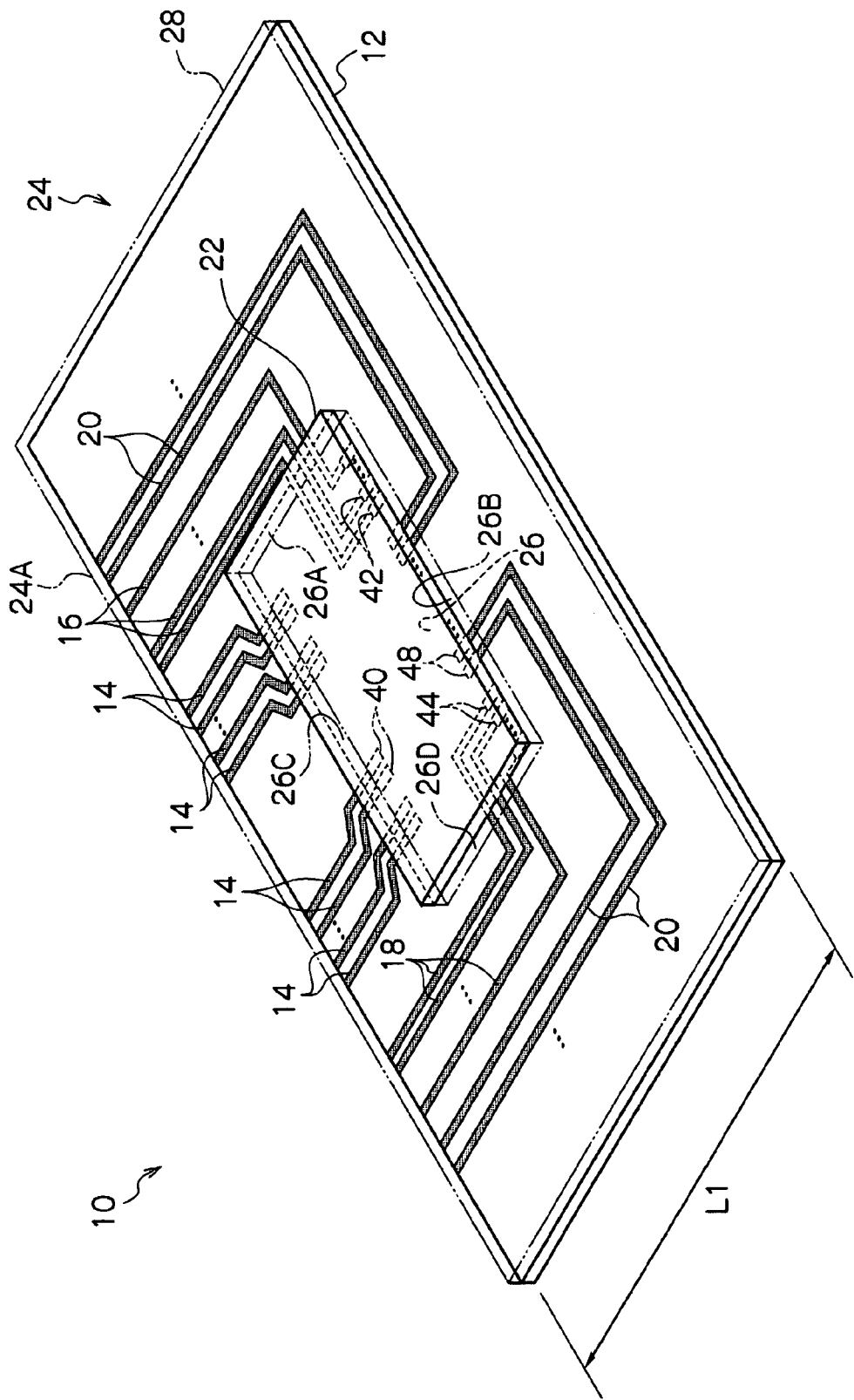
FIG. 1 is a perspective view showing a semiconductor chip package employing a tape wiring substrate in accordance with a first exemplary embodiment of the present invention.
Figure 2:
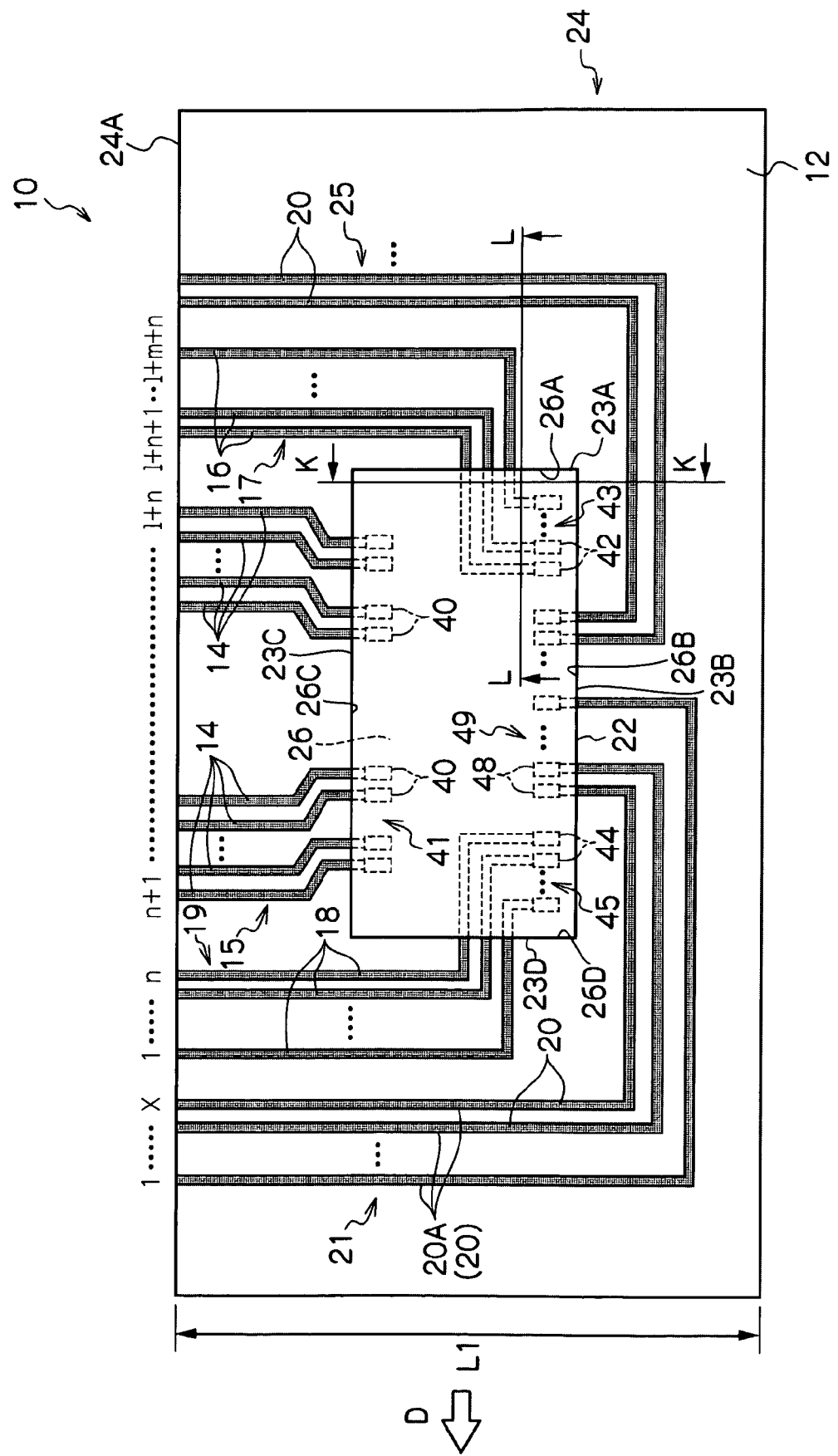
FIG. 2 is a plan view showing the semiconductor chip package employing the tape wiring substrate in accordance with the first exemplary embodiment of the invention.

As shown in FIGS. 1 and 2, a gate semiconductor chip package 10 as a semiconductor chip package is structured so as to include a base film 12 made of a soft material, a first output wiring 14 serving as a first wiring, a second output wiring 16 serving as a second wiring, a third output wiring 18 serving as a third wiring, an input wiring 20 serving as a fourth wiring, and a gate driving semiconductor chip 22 electrically connected to each of the wirings 16, 18 and 20.

The input wiring 20 includes a wiring to which a signal controlling the gate driving semiconductor chip 22 is input, and a wiring which outputs a signal controlling the other gate driving semiconductor chip. Accordingly, the input wiring 20 can be separately expressed by the first input/output wiring and the second input/output wiring. However, for convenience of description, these are described below as input wiring 20 without differentiating therebetween.

The gate driving semiconductor chip 22 is mounted to the base film 12 in accordance with a flip chip method. In other words, the gate semiconductor chip package 10 is a semiconductor device provided with the gate driving semiconductor chip 22 in the base film 12.

Further, a tape wiring substrate 24 is structured so as to include the base film 12, the first output wiring 14 formed in one surface of the base film 12, the second output wiring 16, the third output wiring 18 and the input wiring 20. One end portions of the first output wiring 14, the second output wiring 16, the third output wiring 18 and the input wiring 20 are formed along one end 24A of the base film 12.

Further, a chip mounting portion 26 formed as a rectangular shape in a plan view is formed in a region in which the semiconductor chip 22 is mounted on the base film 12. The chip mounting portion 26 indicates a region which is surrounded by a first side 26C which is closest to the one end 24A of the base film 12, a second line 26A and a third side 26D which are adjacent to the first side 26C, and a fourth side 26B which forms an opposite side to the first side 26C.

In this case, the base film 12 is formed by an insulating material having a thickness between 20 μm and 100 μm. Further, the insulating base film 12 can employ an insulating material such as a polyimide resin, a polyester resin or the like as a main material.

Figure 5:
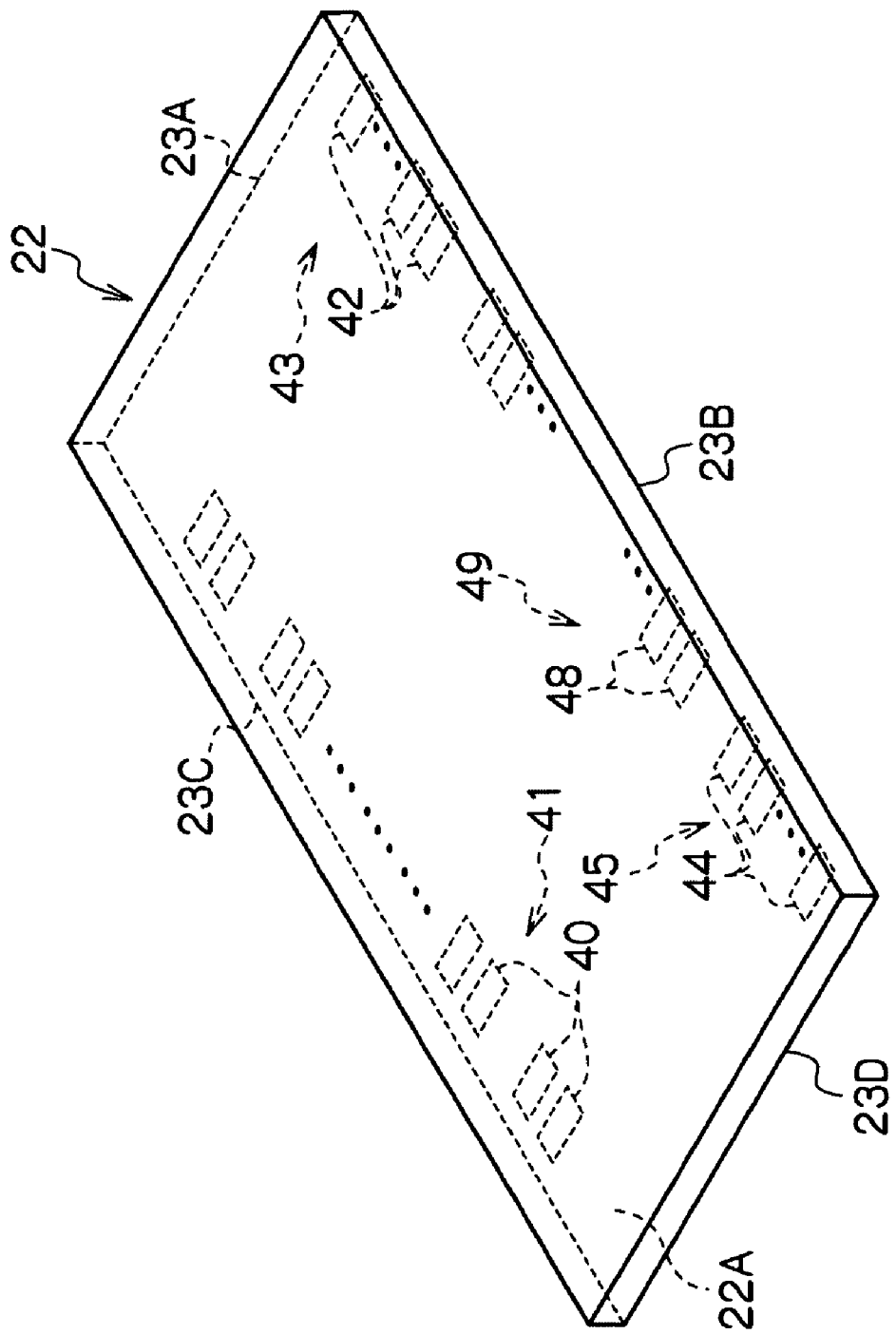
FIG. 5 is a perspective view showing a semiconductor chip mounted to the tape wiring substrate in accordance with the first exemplary embodiment of the invention.

As shown in FIG. 5, a main surface 22A of the semiconductor chip 22 has a fist side 23C, a second side 23A, a third side 23D and a fourth side 23B in correspondence to the chip mounting portion 26. In the semiconductor chip 22, output pads 40 are arranged along the first line 23C, and output pads 42 and 44 and an input/output pads 48 are arranged along the fourth side 23B.

Plural input/output pads 48 are arranged between an output pad group 43 and an output pad group 45 which are constructed by plural output pads 42 and plural output pads 44.

On the other hand, as shown in FIGS. 1 and 2, the chip mounting portion 26 is provided with the other end portions of the first output wiring 14, the second output wiring 16, the third output wiring 18 and the input wiring 20. The other end portion of the first output wiring 14 is provided along the first side 26C of the chip mounting portion. The other end portions of the second output wiring 16, the third output wiring 18 and the input wiring 20 are provided along the fourth side 26B of the chip mounting portion.

Further, the other end portion of the input wiring 20 is disposed between the other end portion of the second output wiring 16 and the other end portion of the third output wiring 18.

Further, in order to protect each of the wirings 14, 16, 18 and 20 formed in the tape wiring substrate 24 from an external impact, and to prevent an unnecessary electric short-circuit between each of the wirings 14, 16, 18 and 20 and the semiconductor chip 22, the portions other than the chip mounting portion 26 are covered with a protecting film 28. In this case, a solder resist is typically used as the protecting film 28.

Further, the wiring layers of the first output wiring 14, the second output wiring 16, the third output wiring 18 and the input wiring 20 are formed at a thickness about 5 μm to 20 μm, and generally a metal material such as a cupper foil (Cu) or the like is used for the wiring layers. Preferably, a brass, gold, nickel or solder plating is applied to a surface of the cupper foil.

In this case, as a method of forming the cupper foil corresponding to one example of the wiring layer on the base film 12, there are a casting, a laminating, an electroplating and the like. The casting is a method of seeding a liquid phase base film on a metal rolling cupper foil so as to thermally cure. The laminating is a method of putting a base film metal rolling cupper foil so as to thermally crimp. The electroplating is a method of evaporating a cupper seed layer on the base film, installing the base film into an electrolyte in which the cupper is melted, and applying an electricity so as to form the cupper foil. Further, a method of patterning the wiring in the cupper foil forms a wiring constructing a predetermined circuit by promoting a photo/etching process in the cupper foil so as to selectively etch the cupper foil.

As shown in FIG. 2, it is technically general that each of the first output wiring 14, the second output wiring 16, the third output wiring 18 and the input wiring 20 is constructed by plural wirings, and they form groups. In the following description, each of the wirings is described by singular for simplifying the description.

The first output wiring 14 extends from the one end 24A of the base film 12, comes across the first side 26C of the chip mounting portion 26 (toward a first direction) and extends into the chip mounting portion 26. Further, the other end portion of the first output wiring 14 is structured so as to be electrically connected to the output pad 40 arranged along the first side 23C in the main surface 22A (refer to FIG. 5) of the semiconductor chip 22.

Further, the second output wiring 16, which extends along the second side 26A of the chip mounting portion 26 from the one end 24A of the base film 12, is arranged such that it bends to cross the second side 26A and enter into the chip mounting portion 26.

Further, the other end portion of the second output wiring 16 is bent from a midstream within the chip mounting portion 26, and extends toward the fourth side 26B which is orthogonal to the second side 26A of the chip mounting portion 26. In other words, the second output wiring 16 within the chip mounting portion 26 is disposed so as to be bent toward the fourth side 26B while making progress in a vertical direction to the second side 26A of the chip mounting portion 26. The other end portion disposed within the chip mounting portion 26 is structured so as to be electrically connected to the output pad 42 provided in the semiconductor chip 22.

Further, the third output wiring 18 which extends along the third side 26D of the chip mounting portion 26 from the one end 24A of the base film 12, is arranged such that it bends to cross the third side 26D and enter into the chip mounting portion 26.

Further, the other end portion of the third output wiring 18 is bent from a midstream within the chip mounting portion 26, and extends toward the fourth side 26B of the chip mounting portion 26. In other words, the third output wiring 18 within the chip mounting portion 26 is disposed so as to be bent toward the fourth side 26B while making progress in a vertical direction to the third side 26D of the chip mounting portion 26. The other end portion of the third output wiring 18 within the chip mounting portion 26 is structured so as to be electrically connected to the output pad 44 provided in the semiconductor chip 22.

Further, the input wiring 20 extends from the one end 24A of the base film 12 so as to extend along the second side 26A and the third side 26D of the chip mounting portion 26, is bent from a midstream, and extends along the fourth side 26B of the chip mounting portion 26. Further, the input wiring 20 is bent from a midstream, comes across the fourth side 26B of the chip mounting portion 26 (in an inverse direction to the first direction), and thereafter enters into the chip mounting portion 26. The other end portion arranged within the chip mounting portion 26 is structured so as to be electrically connected to the input/output pad 48 provided in the semiconductor chip 22.

In this case, in the output pads 42 and the output pads 44, it is necessary to reverse an arrangement order in comparison with the case that the wiring is put in the chip mounting portion 26 so as to come across the fourth side 26B of the chip mounting portion 26. In other words, it is possible to make the line of the second output wiring 16 and the third output wiring 18 identical to the line of the output pad 42 and the output pad 44, as seen from the one end 24A of the tape wiring substrate 24.

A description will be given in detail of the tape wiring substrate 24 with reference to FIG. 2. The first output wiring 14, the second output wiring 16 and the third output wiring 18 formed on the tape wiring substrate 24 are generally formed of plural wirings as mentioned above. Supposing, for example, that the first output wiring 14 includes one line, the second output wiring 16 includes m lines, and the third output wiring 18 includes n lines, then the third output wiring group 19 is allocated output terminal numbers 1 to n, the first output wiring group 15 is allocated terminal numbers n+1 to 1+n, and the second output wiring group 17 is allocated terminal numbers 1+n+1 to 1+m+n, sequentially.

The output pad corresponding to the terminal number 1 is disposed at a position which is closest to the third side 26D in the output pad group 45. The output pad corresponding to the terminal number n is disposed at a position which is farthest from the third side 26D in the output pad group 45.

Further, the input wiring 20 is formed by plural wirings as mentioned above. Exemplifying the case that the second input/output wiring 20A corresponding to one of the input wirings 20 is constituted by x number of wirings, the second input/output wiring group 21 is allocated by the terminal numbers 1 to x sequentially.

The second input/output wiring 20A corresponding to the terminal number 1 is disposed at a position which is farthest from the third side 26D in the second input/output wiring group 21. The second input/output wiring 20A corresponding to the terminal number x is disposed at a position which is closest to the third side 26D in the second input/output wiring group 21.

The input/output pad 48 corresponding to the terminal number 1 of the second input/output wiring group 21 is disposed at a position which is farthest from the third side 26D. The input/output pad 48 corresponding to the terminal number x of the second input/output wiring group 21 is disposed at a position which is closest to the third side 26D.

Accordingly, the lines of the output pad groups 41, 43 and 45 corresponding to the first output wiring group 15, the second output wiring group 17 and the third output wiring group 19 are structured to be identical, as seen from the one end 24A of the tape wiring substrate 24. Further, the lines of the first input/output wiring group 25 and the second input/output wiring group 21 are structured inversely to the arrangement of the input/output pad group 49.

Figure 3:
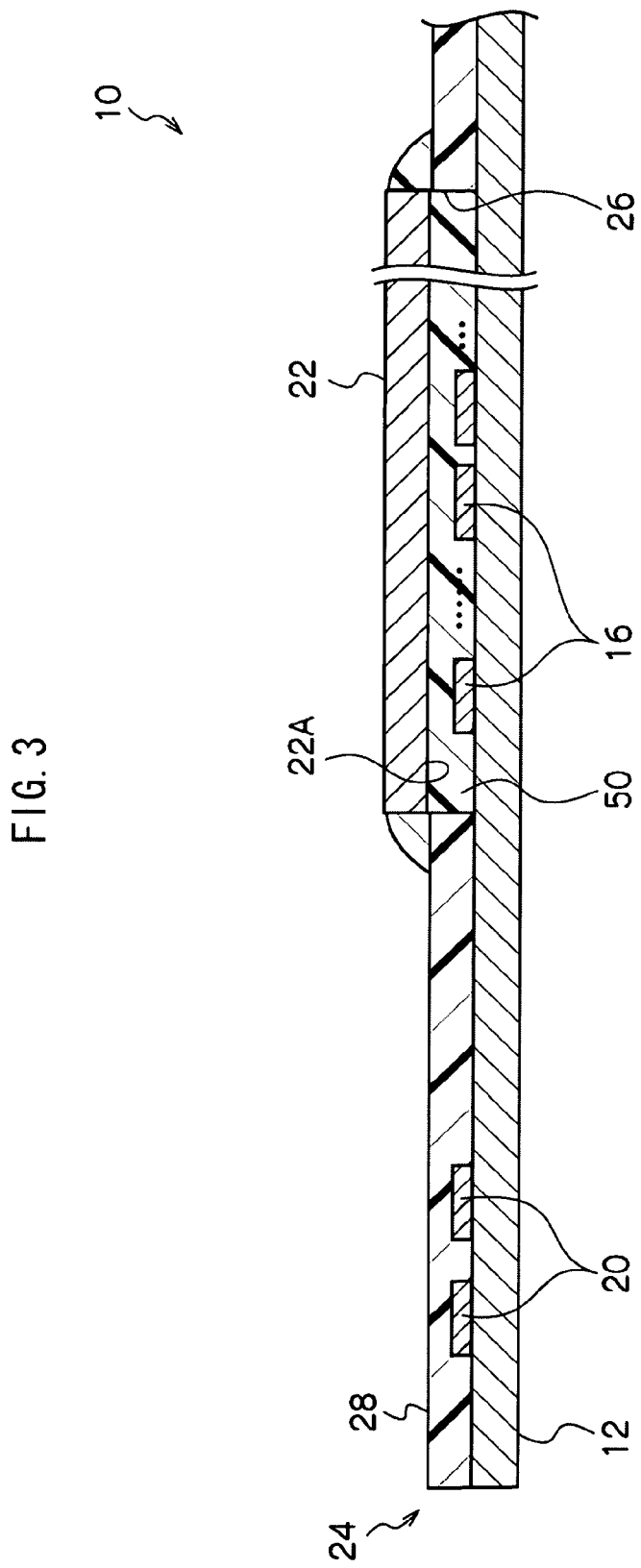
FIG. 3 shows the semiconductor chip package employing the tape wiring substrate in accordance with the first exemplary embodiment of the invention, and is a cross sectional view along a line KK shown in FIG. 2.
Figure 4:
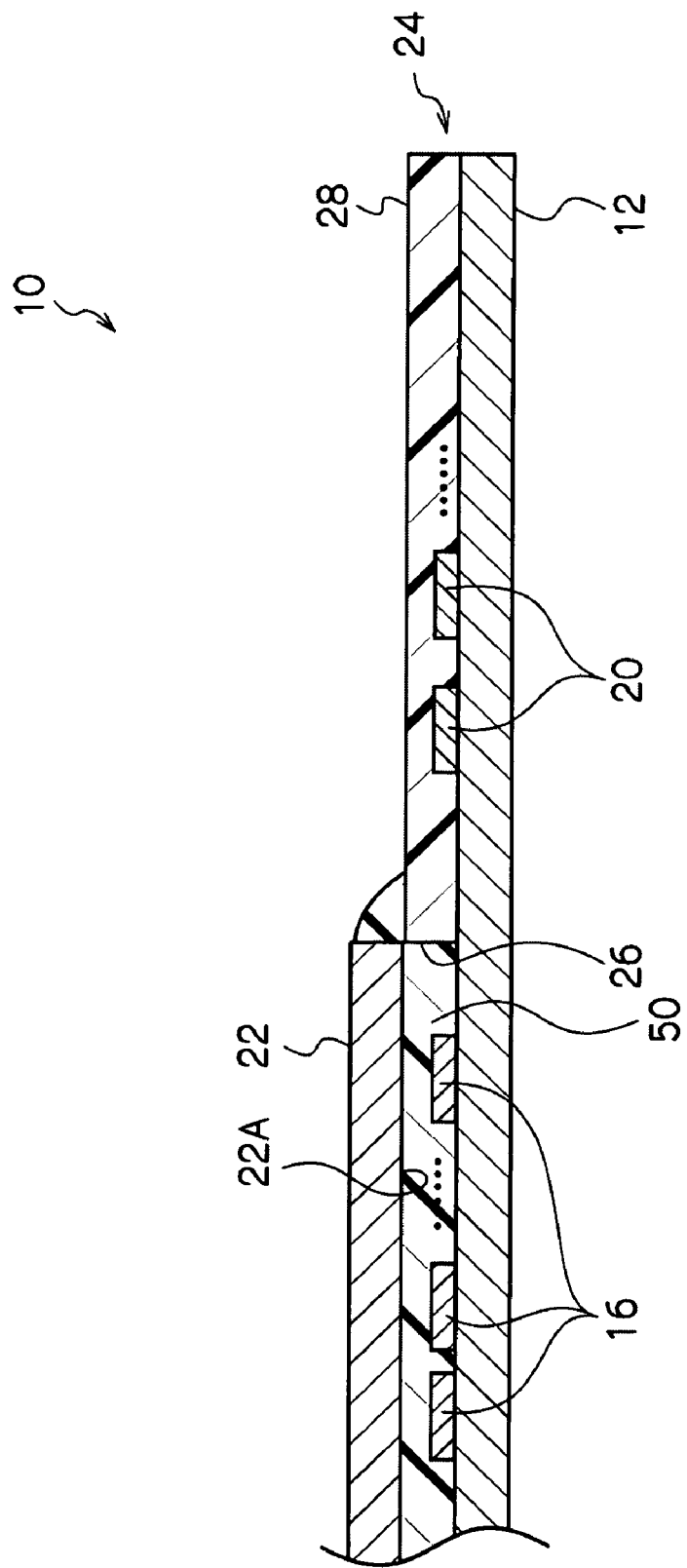
FIG. 4 shows the semiconductor chip package employing the tape wiring substrate in accordance with the first exemplary embodiment of the invention, and is a cross sectional view along a line LL shown in FIG. 2.

As shown in FIGS. 3 and 4, the second output wiring 16 is formed within the chip mounting portion 26 to which the semiconductor chip 22 is mounted.

Further, the other end portion of each of the wirings is electrically connected to each of the electrode pads of the semiconductor chip 22 within the chip mounting portion 26, and each of the wirings formed in an outer portion of the chip mounting portion 26 is covered with the protecting film 28 for preventing an unnecessary short-circuit in the other portions.

Further, the one end portion of each of the wirings arranged in the chip mounting portion 26 while being exposed from the protecting film 28, and each of the electrode pads formed in the semiconductor chip 22 are sealed by a sealing resin 50 on the tape wiring substrate 24. In this case, a material of the sealing resin 50 can use, for example, an epoxy resin or a silicone resin.

As mentioned above, it is possible to make a length L1 (refer to FIGS. 1 and 2) of the base film 12 short by putting the second output wiring 16 and the third output wiring 18 in the chip mounting portion 26 while coming across the second side 26A and the third side 26D, and it is possible to downsize the tape wiring substrate 24.

Further, it is possible to parallelize the tape wiring substrate 24 to the semiconductor chip provided with a lot of electrode pads by extending the input wiring 20 along the fourth side 26B of the chip mounting portion 26, and bending from the midstream so as to enter into the chip mounting portion 26 while coming across the fourth side 26B of the chip mounting portion 26.

Further, it is possible to improve a freedom of arrangement of the semiconductor chip 22 in comparison with the case that the second output wiring 16 and the third output wiring 18 are put in the chip mounting portion 26 while coming across the fourth side 26B, by putting the second output wiring 16 and the third output wiring 18 in the chip mounting portion 26 while coming across the second side 26A and the third side 26D.

Further, since the chip mounting portion 26 is formed as a rectangular shape in a plan view, it is possible to form each of the wirings along each of the sides of the chip mounting portion or orthogonal to each of the sides, and it is possible to improve a yield ratio of the base film 12.

Further, all the wirings extend toward the chip mounting portion 26 from the one end 24A of the base film 12. Accordingly, it is possible to simplify the arrangement of the electrode terminal connected to the wirings.

Next, a description will be given of a second exemplary embodiment of a tape wiring substrate 89 in accordance with the present invention with reference to FIGS. 6 to 8.

In this case, the same reference numerals are attached to the same members as those of the first exemplary embodiment, and a description thereof will be omitted.

Figure 6:
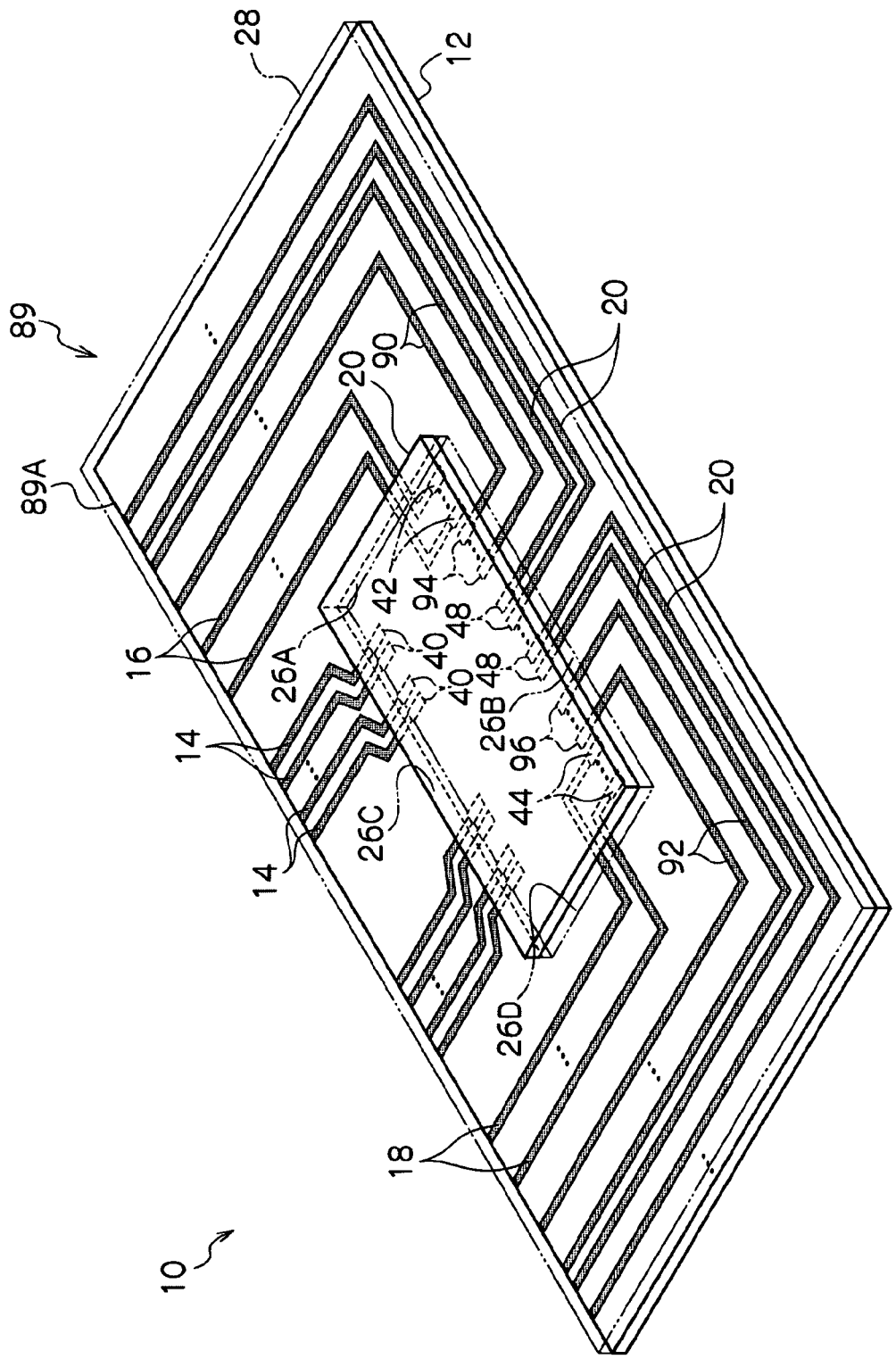
FIG. 6 is a perspective view showing a semiconductor chip package employing a tape wiring substrate in accordance with a second exemplary embodiment of the invention.
Figure 7:
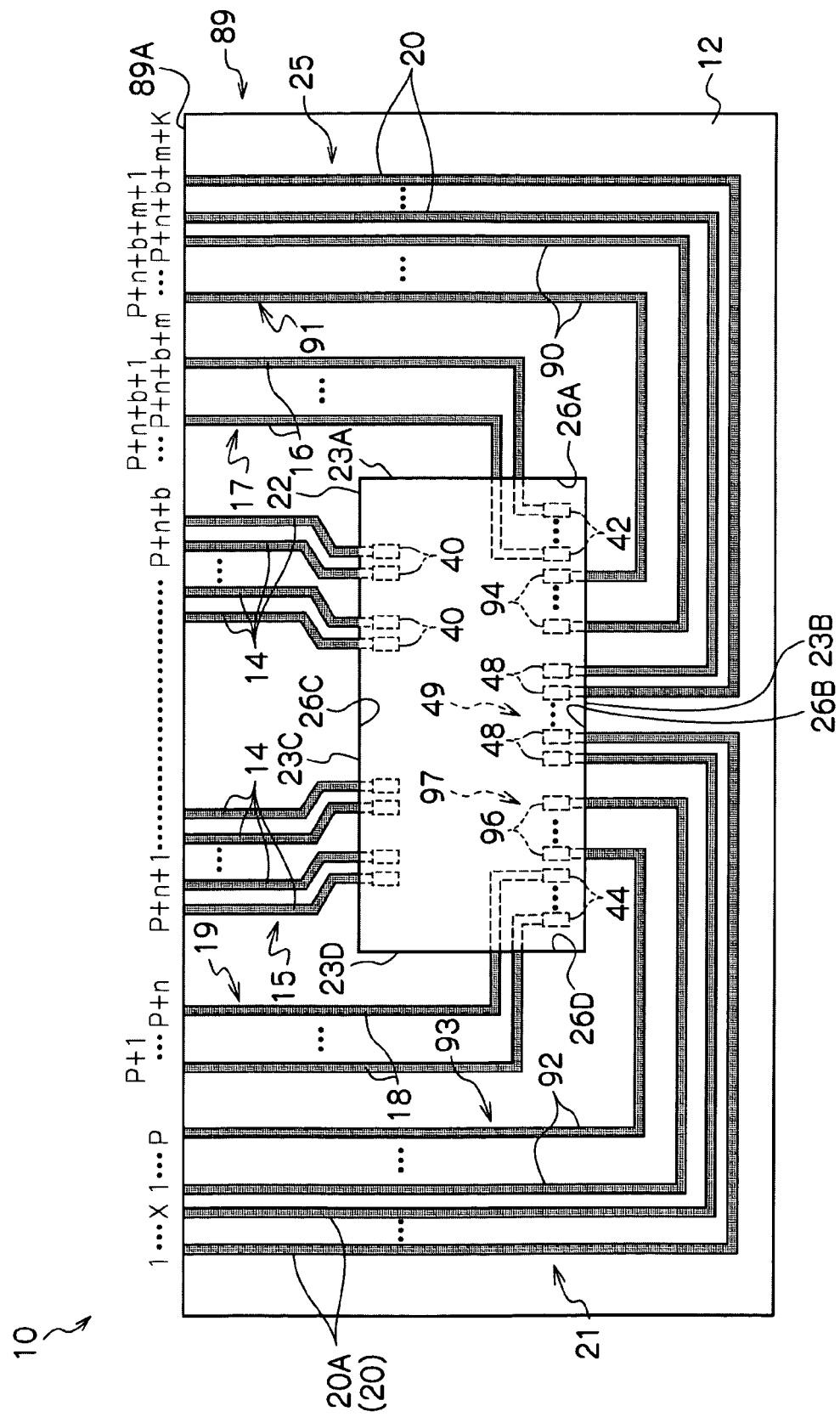
FIG. 7 is a plan view showing the semiconductor chip package employing the tape wiring substrate in accordance with the second exemplary embodiment of the invention.

As shown in FIGS. 6 and 7, in this exemplary embodiment, a fourth output wiring 90 is provided between the second output wiring 16 and the input wiring 20, such as the first exemplary embodiment. In the same manner, a fifth output wiring 92 is provided between the third output wiring 18 and the input wiring 20.

Describing in detail, one end portions of the fourth output wiring 90 and the fifth output wiring 92 extend along the second side 26A and the third side 26D of the chip mounting portion 26 from one end 89A, are bent from a midstream, and extend along the fourth side 26B of the chip mounting portion 26. Further, the fourth output wiring 90 and the fifth output wiring 92 are structured so as to be bent from a midstream, come across the fourth side 26B of the chip mounting portion 26, and thereafter enter into the chip mounting portion 26. Further, the other end portions of the fourth output wiring 90 and the fifth output wiring 92 are connected to output pads 94 and 96 provided in the semiconductor chip 22. In this case, the one end portion of the fourth output wiring 90 is disposed between the one end portion of the second output wiring 16 and the one end portion of the input wiring 20. One end portion of the fifth output wiring 92 is disposed between the one end portion of the third output wiring 18 and the one end portion of the input wiring 20.

The output pads 94 and 96 are arranged along the fourth side 23B of the semiconductor chip 22 in the same manner as the output pads 42 and 44 and the input/output pad 48. The output pad 94 is disposed between the output pad 42 and the input/output pad 48, and the output pad 96 is disposed between the output pad 44 and the input/output pad 48.

A description will be given of the fourth output wiring 90 and the fifth output wiring 92 which are formed in the tape wiring substrate 89 with reference to FIG. 7. The fourth output wiring 90 and the fifth output wiring 92 which are formed in the tape wiring substrate 89 are generally constructed by plural wirings as mentioned above.

Exemplifying the case that the number of the first output wiring 14 is b, the number of the second output wiring 16 is m, the number of the third output wiring 18 is n, the number of the fourth output wiring 90 is k, and the number of the fifth output wiring 92 is p, the fifth output wiring group 93 is allocated by output terminal numbers 1 to p, the third output wiring group 19 is allocated by output terminal numbers p+1 to p+n, the first output wiring group 15 is allocated by terminal numbers p+n+1 to p+n+b, the second output wiring group 17 is allocated by terminal numbers p+n+b+1 to p+n+b+m, and the fourth output wiring group 91 is allocated by terminal numbers p+n+b+m+1 to p+n+b+m+k, sequentially.

The output pad 96 corresponding to the terminal number 1 is disposed at a position which is farthest from the third side 26D in the output pad group 97. The output pad 96 corresponding to the terminal number p is disposed at a position which is closest to the third side 26D in the output pad group 97.

Further, the input wiring 20 is formed by plural wirings as mentioned above. Exemplifying the case that the second input/output wiring 20A corresponding to one of the input wirings 20 is constituted by x number of wirings, the second input/output wiring group 21 is allocated by the terminal numbers 1 to x sequentially.

The second input/output wiring 20A corresponding to the terminal number 1 is disposed at a position which is farthest from the third side 26D in the second input/output wiring group 21. The second input/output wiring 20A corresponding to the terminal number x is disposed at a position which is closest to the third side 26D in the second input/output wiring group 21.

The input/output pad 48 corresponding to the terminal number 1 of the second input/output wiring group 21 is disposed at a position which is farthest from the third side 26D. The input/output pad 48 corresponding to the terminal number x of the second input/output wiring group 21 is disposed at a position which is closest to the third side 26D.

Accordingly, the lines of the output pad groups 41, 43 and 45 corresponding to the first output wiring group 15, the second output wiring group 17 and the third output wiring group 19 are structured to be identical, as seen from the one end 89A of the tape wiring substrate 89. Further, the lines of the first input/output wiring group 25 and the second input/output wiring group 21 are structured inversely to the arrangement of the output pad group 97 and the input/output pad group 49.

On the other hand, the semiconductor chip 22 used for driving gate is generally provided with a flip flop corresponding to each of the output pads 40, 42, 44, 94 and 96, and a shift register is constructed by connecting the flip flops in series.

A description will be given in detail of an arrangement of the shift register of the semiconductor chip 22 with reference to FIGS. 8A and 8B. The shift register 30 is constructed by a shift register 30A corresponding to the output pad 40, a shift register 30B corresponding to the output pad 42, and a shift register 30C corresponding to the output pad 94. As a matter of convenience for description, the shift registers corresponding to the output pads 44 and 96 are omitted.

An output of the shift register 30C is connected to an input of the shift register 30B, and an output of the shift register 30B is connected to an input of the shift register 30A. A connecting relation of the shift registers 30A and 30C is shown as one example. In the case of using a bidirectional shift register, the relation between the input and the output is inversed.

The shift register 30A is disposed in the vicinity of the output pad 40, the shift register 30B is disposed in the vicinity of the output pad 42, and the shift register 30C is disposed in the vicinity of the output pad 94. The output pads 40, 42 and 94 and the shift registers 30A, 30B and 30C are arranged at an approximately equal distance. The flip flops are connected in such a manner that a shift direction of the shift register 30C is inverted to a shift direction of the shift registers 30A and 30B.

Describing in detail, the flip flop corresponding to the output of the shift register 30C is arranged at a position which is farther than the flip flop corresponding to the output of the shift register 30B, with respect to the output of the flip flop corresponding to the output of the shift register 30C (the output of the flip flop in the final stage of the shift register 30C). In this case, a control circuit or the like generating an output signal on the basis of the input/output signals is disposed in a center region of the semiconductor chip 22 or in the vicinity of the input/output pad 48.

As shown in FIGS. 6 and 7, it is possible to parallelize to a lot of output pads 94 and 96 provided in the semiconductor chip 22, by putting the other end portions of the fourth output wiring 90 and the fifth output wiring 92 in the chip mounting portion 26 while coming across the fourth side 26B of the chip mounting portion 26, and connecting to the output pads 94 and 96 provided along the fourth side 23B of the semiconductor chip 22. In this case, the output pad 94 is disposed between the output pad 42 and the input/output pad 48, and the output pad 96 is disposed between the output pad 44 and the input/output pad 48. Further, the other end portion of the fourth output wiring 90 is disposed between the other end portion of the second output wiring 16 and the other end portion of the input wiring 20. The other end portion of the fifth output wiring 92 is disposed between the other end portion of the third output wiring 18 and the other end portion of the input wiring 20.

In the semiconductor chip having the conventional structure, it can be achieved only by simply arranging the shift registers in one line along the position corresponding to the first side 23C of the invention. However, in the semiconductor chip having the conventional structure, it is possible to solve the problem that the wiring becomes very complicated in the case that the semiconductor chip package 10 is achieved by using the tape wiring substrate 24 in accordance with the invention, and it is possible to easily design by arranging the shift registers corresponding to the output pads in the vicinity of the pad.

Further, since the distances from the shift registers to the output pads become constant, it is not necessary to adjust a signal delay from the shift register to the output pad between the outputs, and it is possible to more easily design.

Further, it is possible to allow the shift register 30C to laconically receive the signal from the processing circuit arranged in the center of the chip, by arranging the output pad 94 between the input/output pad 48 and the output pad 42.

Further, in comparison with the case that the positions of the output pad 42 and the output pad 94 are inverted to the invention, it is possible to make the distance between the output of the shift register 30B and the shift register 30A short, and it is possible to make the signal delay less.

Next, a description will be given of a third exemplary embodiment of a tape wiring substrate 101 in accordance with the invention with reference to FIGS. 9 and 10.

In this case, the same reference numerals are attached to the same members as those of the first exemplary embodiment, and a description thereof will be omitted.

Figure 9:
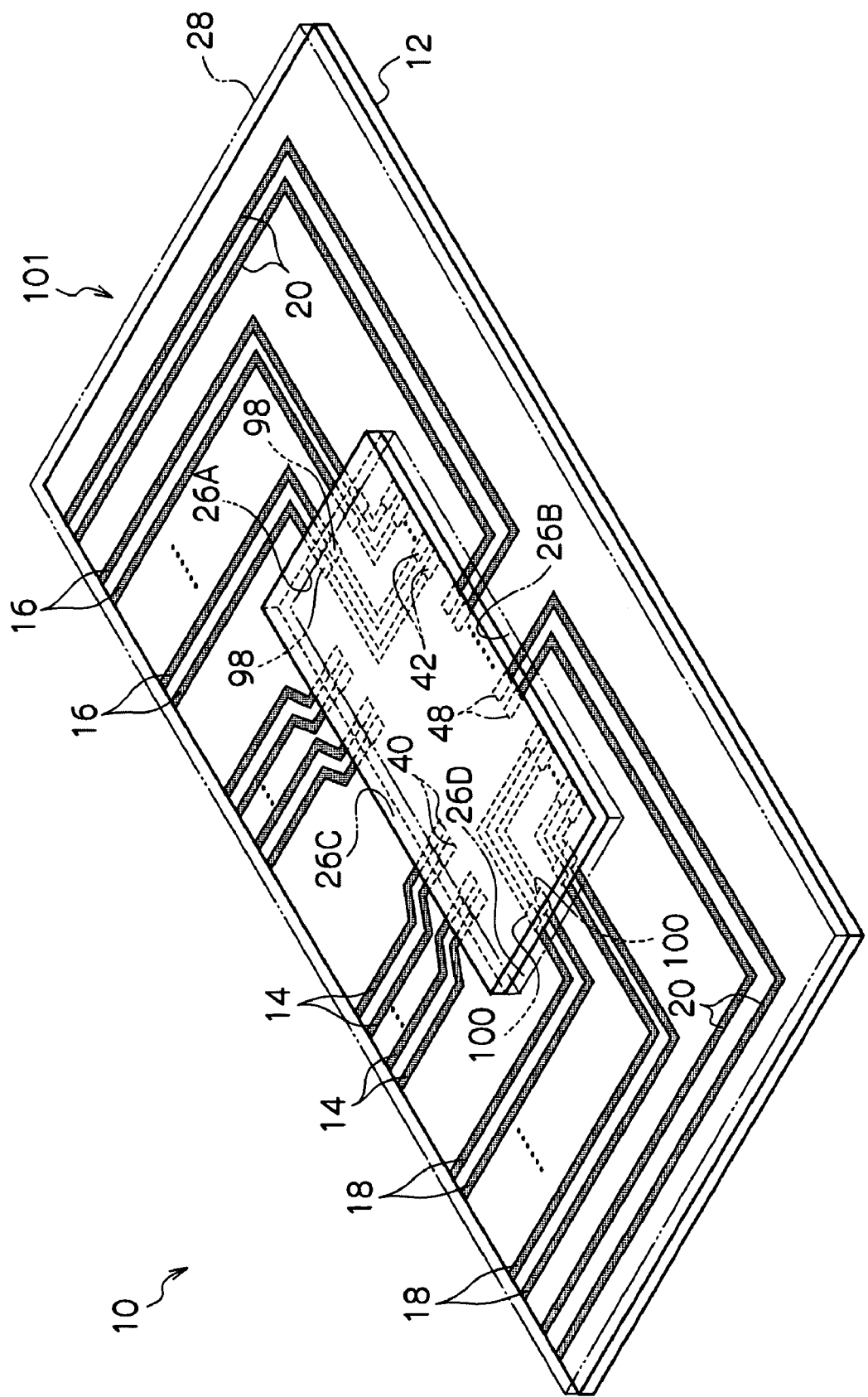
FIG. 9 is a perspective view showing a semiconductor chip package employing a tape wiring substrate in accordance with a third exemplary embodiment of the invention.
Figure 10:
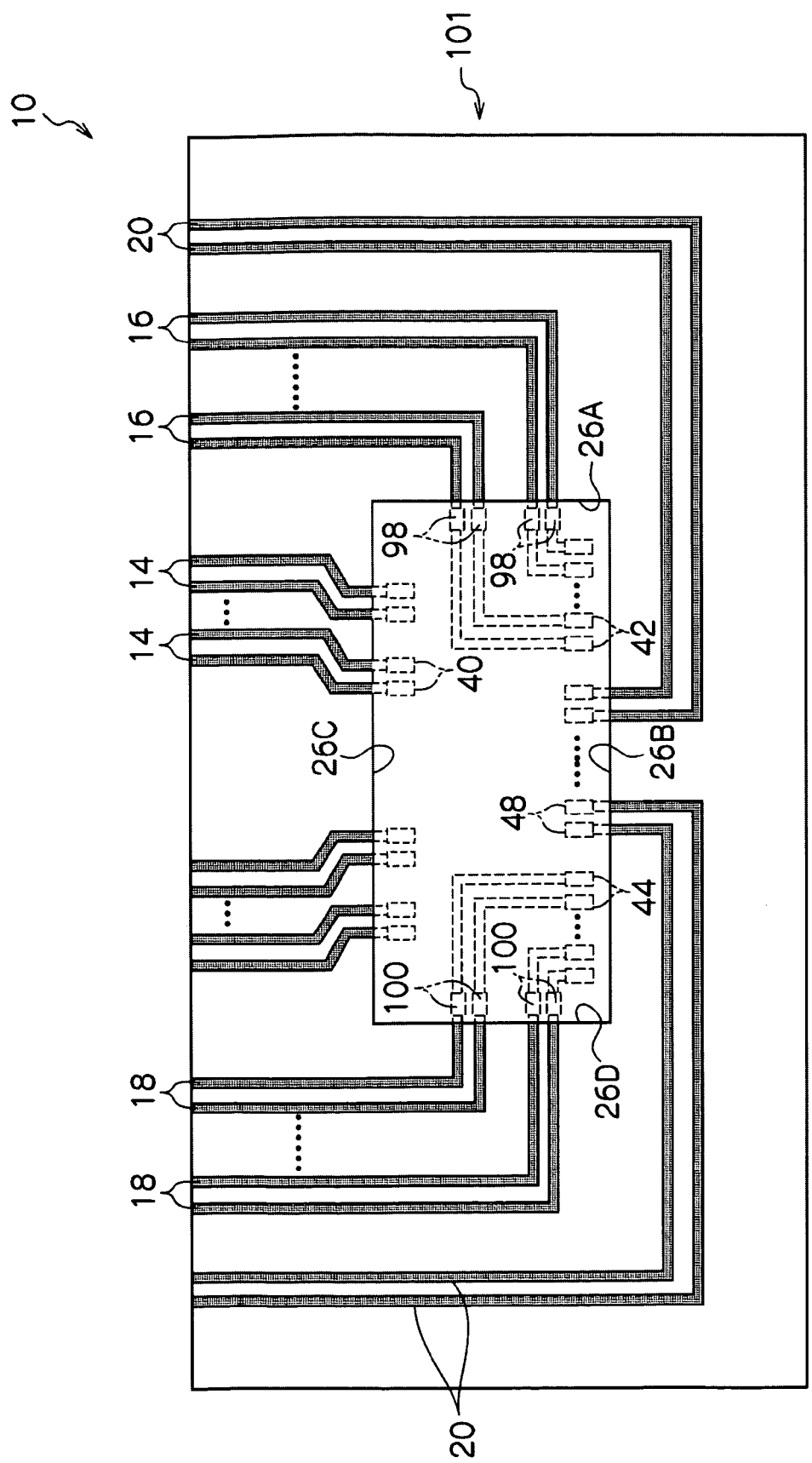
FIG. 10 is a plan view showing the semiconductor chip package employing the tape wiring substrate in accordance with the third exemplary embodiment of the invention.

As shown in FIGS. 9 and 10, in the third exemplary embodiment, a reinforcing pad 98 is provided in an opposing surface of the semiconductor chip 22 opposing to the second output wiring 16 just after the second output wiring 16 enters into the inner portion of the chip mounting portion 26 while coming across the second side 26A of the chip mounting portion 26, as is different from the first exemplary embodiment. Further, the reinforcing pad 98 is connected to the second output wiring 16.

In the same manner, a reinforcing pad 100 is provided in an opposing surface of the semiconductor chip 22 opposing to the third output wiring 18. Further, the reinforcing pad 100 is connected to the third output wiring 18. It is desirable that the reinforcing pads 98 and 100 are provided independently from the internal wiring of the semiconductor chip 22. As occasion demand, it is possible to reduce a wiring resistance by connecting the reinforcing pads 98 and 100 corresponding to the output pads 42 and 44 corresponding to the second and third output wirings 16 and 18 by the internal wiring.

As mentioned above, it is possible to inhibit the semiconductor chip 22 from peeling off from the tape wiring substrate 24 by connecting the reinforcing pad 98 and the reinforcing pad 100, to the second output wiring 16 and the third output wiring 18.

Next, a description will be given of a fourth exemplary embodiment of a tape wiring substrate 103 in accordance with the invention with reference to FIGS. 11 and 12.

In this case, the same reference numerals are attached to the same members as those of the first exemplary embodiment, and a description thereof will be omitted.

Figure 11:
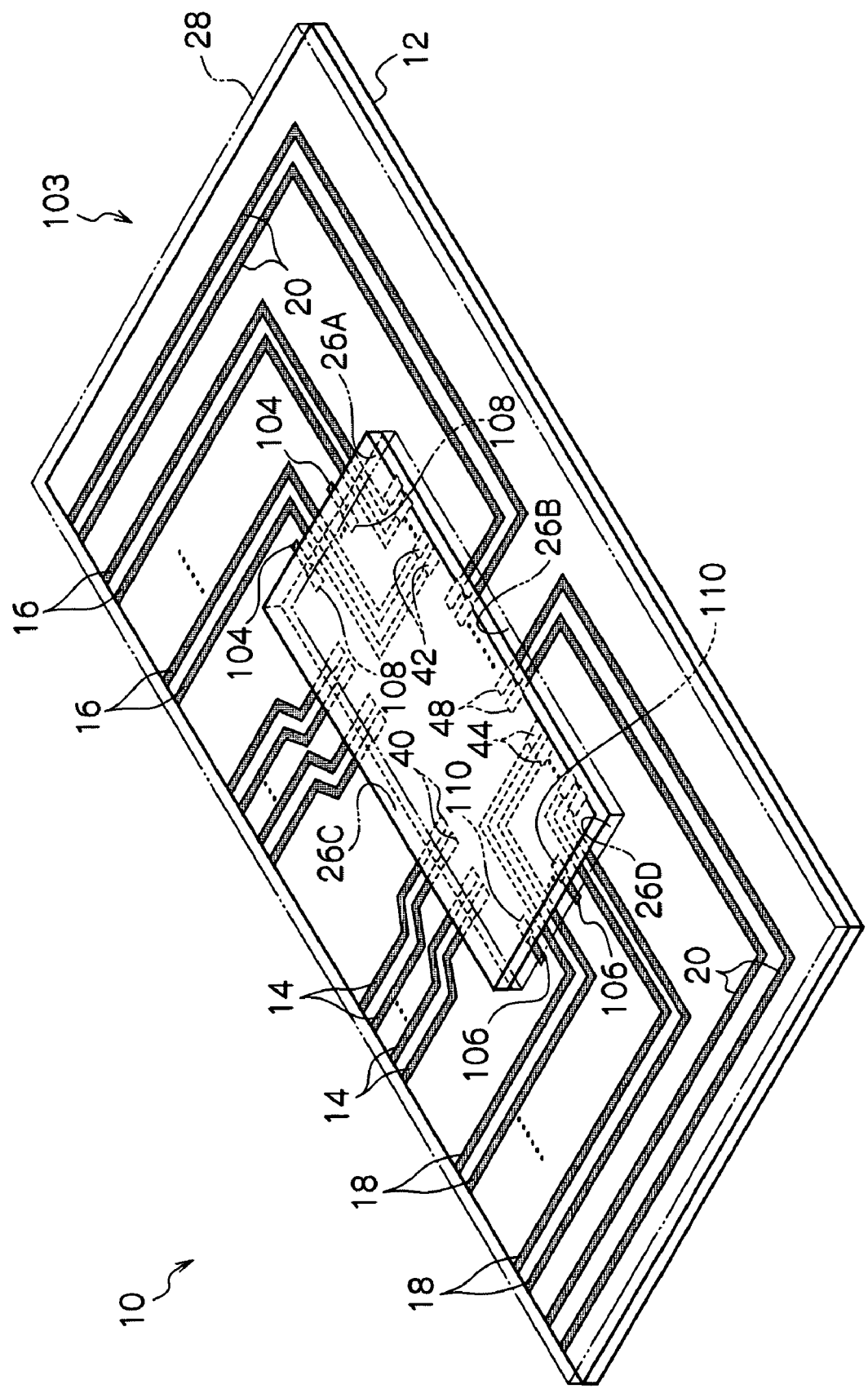
FIG. 11 is a perspective view showing a semiconductor chip package employing a tape wiring substrate in accordance with a fourth exemplary embodiment of the invention.
Figure 12:
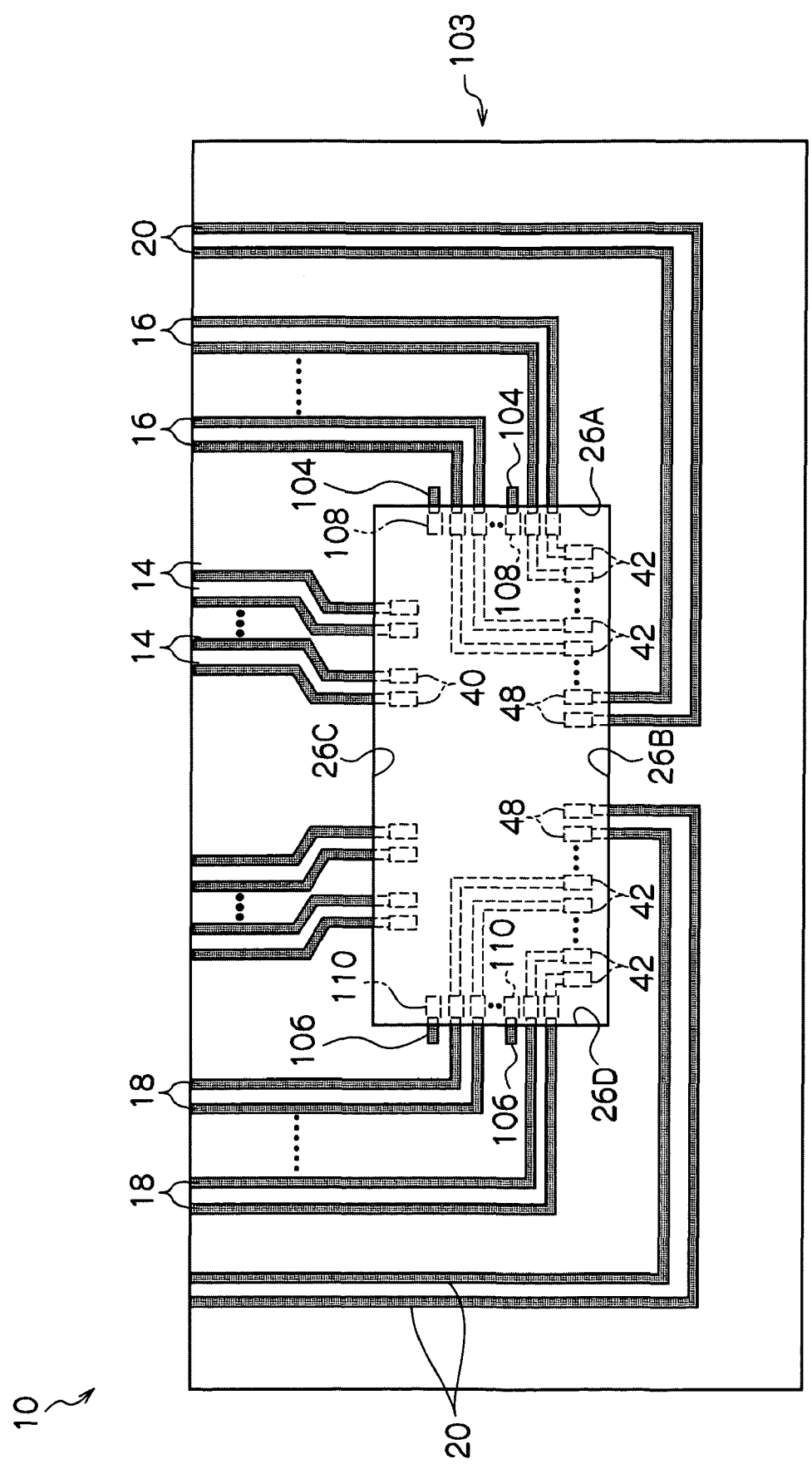
FIG. 12 is a plan view showing the semiconductor chip package employing the tape wiring substrate in accordance with the fourth exemplary embodiment of the invention.

As shown in FIGS. 11 and 12, in the fourth exemplary embodiment, a dummy wiring 104 and a dummy wiring 106 are formed on the base film 12, in such a manner as to come across the second side 26A and the third side 26D of the chip mounting portion 26, as is different from the first exemplary embodiment. Reinforcing pad 108 and a reinforcing pad 110 are provided in an opposing surface of the semiconductor chip 22 opposing to the dummy wiring 104 and the dummy wiring 106. Further, the dummy wiring 104 and the dummy wiring 106 are connected to the reinforcing pad 108 and the reinforcing pad 110.

As mentioned above, since it is possible to freely set the arranged positions of the reinforcing pads 108 and 110 in comparison with the case that the reinforcing pad is provided in conformity to the position of the existing wiring, it is possible to effectively inhibit the semiconductor chip 22 from peeling off from the tape wiring substrate 24.

What is claimed is:

1. A tape wiring substrate comprising:
a base film provided with a rectangular chip mounting region comprising a first side, second and third sides adjacent to the first side, and a fourth side opposite to the first side;
a first output wiring group comprising a first end portion arranged along one end of the base film, a second end portion arranged within the chip mounting region along the first side of the chip mounting region, and a first connecting portion connecting the first end portion and the second end portion and arranged in a first direction;
a second output wiring group comprising a first end portion arranged along the one end of the base film, a second portion arranged within the chip mounting region along the fourth side of the chip mounting region, and a second connecting portion that connects the first end portion and the second end portion, intersects the second side of the chip mounting region, and is connected to the second end portion in the first direction;
a third output wiring group comprising a first end portion is arranged along the one end of the base film, a second end portion arranged within the chip mounting region along the fourth side of the chip mounting region, and a third connecting portion that connects the first end portion and the second end portion, intersects the third side of the chip mounting region, and is connected to the second end portion in the first direction;
a first input/output wiring group comprising a first end portion arranged along the one end of the base film, a second end portion arranged within the chip mounting region along the fourth side of the chip mounting region, and a fourth connecting portion that connects the first end portion and the second end portion, intersects the fourth side of the chip mounting region, and is connected to the second end portion in a direction opposite to the first direction; and
a second input/output wiring group comprising a first end portion arranged along the one end of the base film, a second end portion arranged within the chip mounting region along the fourth side of the chip mounting region, and a fifth connecting portion that connects the first end portion and the second end portion, intersects the fourth side of the chip mounting region, and is connected to the second end portion in the direction opposite to the first direction;
wherein the first end of the second output wiring group and the first end of the third output wiring group are arranged between the first end of the first input/output wiring group and the first end of the second input/output wiring group.

2. A semiconductor chip package comprising:
the tape wiring substrate of claim 1; and
a rectangular semiconductor chip having a first output electrode pad group provided along a first side, a second output electrode pad group provided along a second side, a third output electrode pad group provided along the second side, a first input/output electrode pad group provided along the second side, and a second input/output electrode pad group provided along the second side, wherein
the first output electrode pad group and the first output wiring group are connected,
the second output electrode pad group and the second output wiring group are connected,
the third output electrode pad group and the third output wiring group are connected,
the first input/output electrode pad group and the first input/output wiring group are connected, and
the second input/output electrode pad group and the second input/output wiring group are connected.

3. The semiconductor chip package of claim 2, wherein the semiconductor chip includes a fourth output electrode pad group provided along the second side, and a fifth output electrode pad group provided along the second side,
wherein the tape wiring substrate includes
a fourth output wiring group comprising a first end portion arranged along the one end of the base film, a second end portion arranged within the chip mounting region along the fourth side of the chip mounting region, and a sixth connecting portion that connects the first end portion and the second end portion, intersects the fourth side of the chip mounting region, and is connected to the second end portion in a direction opposite to the first direction, and a fifth output wiring group comprising a first end portion arranged along the one end of the base film, a second end portion arranged within the chip mounting region along the fourth side of the chip mounting region, and a seventh connecting portion that connects the first end portion and the second end portion, intersects the fourth side of the chip mounting region, and is connected to the second end portion in the direction opposite to the first direction, and wherein the fourth output electrode pad group and the fourth output wiring group are connected, and the fifth output electrode pad group and the fifth output wiring group are connected.

4. The semiconductor chip package of claim 2, wherein a line arrangement order of the second output wiring group is identical to a line arrangement order of the second output electrode pad.

5. The semiconductor chip package of claim 3, wherein a line arrangement order of the fourth output wiring group is the reverse of a line arrangement order of the fourth output electrode pad.

6. The semiconductor chip package of claim 2, wherein the semiconductor chip is provided with a first reinforcing pad group along a third side which is adjacent to the first side, and is connected to the second output wiring group.

7. The semiconductor chip package of claim 2, wherein the semiconductor chip is provided with a second reinforcing pad along a third side which is adjacent to the first side, wherein the tape wiring substrate is provided with a dummy wiring between the wirings of the second output wiring group, and the dummy wiring is connected to the second reinforcing pad.

8. The semiconductor chip package of claim 3, wherein the semiconductor chip comprises:

a first shift register corresponding to the first output electrode pad group to which the first output wiring group is connected;

a second shift register corresponding to the second output electrode pad group to which the second output wiring group is connected;

a third shift register corresponding to the third output electrode pad group to which the third output wiring group is connected;

a fourth shift register corresponding to the fourth output electrode pad group to which the fourth output wiring group is connected; and a fifth shift register corresponding to the fifth output electrode pad group to which the fifth output wiring group is connected, wherein a shift direction of the fourth shift register is the reverse of a shift direction of the first shift register and the second shift register, and a shift direction of the fifth shift register is the reverse of a shift direction of the first shift register and the third shift register.

9. The semiconductor chip package of claim 8, wherein the first shift register is provided in the vicinity of the first output electrode pad group provided along the first side of the chip mounting region, and the second shift register, the third shift register, the fourth shift register and the fifth shift register are provided in the vicinity of the second output electrode pad group, the third output electrode pad group, the fourth output electrode pad group and the fifth output electrode pad group which are provided along the fourth side of the chip mounting region.

10. The semiconductor chip package of claim 8, wherein a distance between the first shift register and the first output electrode pad group, a distance between the second shift register and the second output electrode pad group, a distance between the third shift register and the third output electrode pad group, a distance between the fourth shift register and the fourth output electrode pad group, and a distance between the fifth shift register and the fifth output electrode pad group are equal to each other.

11. A tape wiring substrate comprising:

a base film provided with a rectangular chip mounting region comprising a first side, second and third sides adjacent to the first side, and a fourth side opposite to the first side;

a first output wiring group comprising a first end portion arranged along one end of the base film, a second end portion arranged within the chip mounting region along the first side of the chip mounting region, and a first connecting portion connecting the first end portion and the second end portion and arranged in a first direction;

a second output wiring group comprising a first end portion arranged along the one end of the base film, a second end portion arranged within the chip mounting region along the fourth side of the chip mounting region, and a second connecting portion that connects the first end portion and the second end portion, intersects the second side of the chip mounting region, and is connected to the second end portion in the first direction;

a third output wiring group comprising a first end portion is arranged along the one end of the base film, a second end portion arranged within the chip mounting region along the fourth side of the chip mounting region, and a third connecting portion that connects the first end portion and the second end portion, intersects the third side of the chip mounting region, and is connected to the second end portion in the first direction;

a first input/output wiring group comprising a first end portion arranged along the one end of the base film, a second end portion arranged within the chip mounting region along the fourth side of the chip mounting region, and a fourth connecting portion that connects the first end portion and the second end portion, intersects the fourth side of the chip mounting region, and is connected to the second end portion in a direction opposite to the first direction;

a second input/output wiring group comprising a first end portion arranged along the one end of the base film, a second end portion arranged within the chip mounting region along the fourth side of the chip mounting region, and a fifth connecting portion that connects the first end portion and the second end portion, intersects the fourth side of the chip mounting region, and is connected to the second end portion in the direction opposite to the first direction;

a fourth output wiring group comprising a first end portion arranged along the one end of the base film, a second end portion arranged within the chip mounting region along the fourth side of the chip mounting region, and a sixth connecting portion that connects the first end portion and the second end portion, intersects the fourth side of the chip mounting region, and is connected to the second end portion in a direction opposite to the first direction; and a fifth output wiring group comprising a first end portion arranged along the one end of the base film, a second end portion arranged within the chip mounting region along the fourth side of the chip mounting region, and a seventh connecting portion that connects the first end portion and the second end portion, intersects the fourth side of the chip mounting region, and is connected to the second end portion in the direction opposite to the first direction.

12. A tape wiring substrate comprising:
a base film provided with a rectangular chip mounting region comprising a first side, second and third sides adjacent to the first side, and a fourth side opposite to the first side;
a first output wiring group comprising a first end portion arranged along one end of the base film, a second end portion arranged within the chip mounting region along the first side of the chip mounting region, and a first connecting portion connecting the first end portion and the second end portion and arranged in a first direction;
a second output wiring group comprising a first end portion arranged along the one end of the base film, a second end portion arranged within the chip mounting region along the fourth side of the chip mounting region, and a second connecting portion that connects the first end portion and the second end portion, intersects the second side of the chip mounting region, and is connected to the second end portion in the first direction;
a third output wiring group comprising a first end portion is arranged along the one end of the base film, a second end portion arranged within the chip mounting region along the fourth side of the chip mounting region, and a third connecting portion that connects the first end portion and the second end portion, intersects the third side of the chip mounting region, and is connected to the second end portion in the first direction;
a first input/output wiring group comprising a first end portion arranged along the one end of the base film, a second end portion arranged within the chip mounting region along the fourth side of the chip mounting region, and a fourth connecting portion that connects the first end portion and the second end portion, intersects the fourth side of the chip mounting region, and is connected to the second end portion in a direction opposite to the first direction;
a second input/output wiring group comprising a first end portion arranged along the one end of the base film, a second end portion arranged within the chip mounting region along the fourth side of the chip mounting region, and a fifth connecting portion that connects the first end portion and the second end portion, intersects the fourth side of the chip mounting region, and is connected to the second end portion in the direction opposite to the first direction;
a fourth output wiring group comprising a first end portion arranged along the one end of the base film, a second end portion arranged within the chip mounting region along the fourth side of the chip mounting region, and a sixth connecting portion that connects the first end portion and the second end portion, intersects the fourth side of the chip mounting region, and is connected to the second end portion in a direction opposite to the first direction; and
a fifth output wiring group comprising a first end portion arranged along the one end of the base film, a second end portion arranged within the chip mounting region along the fourth side of the chip mounting region, and a seventh connecting portion that connects the first end portion and the second end portion, intersects the fourth side of the chip mounting region, and is connected to the second end portion in the direction opposite to the first direction;
wherein the first end of the fourth output wiring group is arranged between the first end of the second output wiring group and the first end of the first input/output wiring group.

13. A tape wiring substrate comprising:
a base film provided with a rectangular chip mounting region comprising a first side, second and third sides adjacent to the first side, and a fourth side opposite to the first side;
a first output wiring group comprising a first end portion arranged along one end of the base film, a second end portion arranged within the chip mounting region along the first side of the chip mounting region, and a first connecting portion connecting the first end portion and the second end portion and arranged in a first direction;
a second output wiring group comprising a first end portion arranged along the one end of the base film, a second end portion arranged within the chip mounting region along the fourth side of the chip mounting region, and a second connecting portion that connects the first end portion and the second end portion, intersects the second side of the chip mounting region, and is connected to the second end portion in the first direction;
a third output wiring group comprising a first end portion is arranged along the one end of the base film, a second end portion arranged within the chip mounting region along the fourth side of the chip mounting region, and a third connecting portion that connects the first end portion and the second end portion, intersects the third side of the chip mounting region, and is connected to the second end portion in the first direction;
a first input/output wiring group comprising a first end portion arranged along the one end of the base film, a second end portion arranged within the chip mounting region along the fourth side of the chip mounting region, and a fourth connecting portion that connects the first end portion and the second end portion, intersects the fourth side of the chip mounting region, and is connected to the second end portion in a direction opposite to the first direction;
a second input/output wiring group comprising a first end portion arranged along the one end of the base film, a second end portion arranged within the chip mounting region along the fourth side of the chip mounting region, and a fifth connecting portion that connects the first end portion and the second end portion, intersects the fourth side of the chip mounting region, and is connected to the second end portion in the direction opposite to the first direction;
a fourth output wiring group comprising a first end portion arranged along the one end of the base film, a second end portion arranged within the chip mounting region along the fourth side of the chip mounting region, and a sixth connecting portion that connects the first end portion and the second end portion, intersects the fourth side of the chip mounting region, and is connected to the second end portion in a direction opposite to the first direction; and
a fifth output wiring group comprising a first end portion arranged along the one end of the base film, a second end portion arranged within the chip mounting region along the fourth side of the chip mounting region, and a seventh connecting portion that connects the first end portion and the second end portion, intersects the fourth side of the chip mounting region, and is connected to the second end portion in the direction opposite to the first direction;

wherein the first end of the fifth output wiring group is arranged between the first end of the third output wiring group and the first end of the second input/output wiring group.

* * * * *